United States Patent [19]
Myer

[11] Patent Number: 5,986,499
[45] Date of Patent: Nov. 16, 1999

[54] PILOT SIGNAL DETECTION SYSTEM USING BAND REJECT FILTER

[75] Inventor: Robert Evan Myer, Denville, N.J.

[73] Assignee: Lucent Technologies Inc., Murray Hill, N.J.

[21] Appl. No.: 09/217,637

[22] Filed: Dec. 21, 1998

[51] Int. Cl.[6] ................................ H03F 3/66; H03F 1/00
[52] U.S. Cl. ............................................ 330/52; 330/151
[58] Field of Search ................................ 330/52, 149, 151

[56] References Cited

U.S. PATENT DOCUMENTS

| | | | |
|---|---|---|---|
| 4,580,105 | 4/1986 | Myer | 330/149 |
| 4,583,049 | 4/1986 | Powell | 330/151 |
| 4,885,551 | 12/1989 | Myer | 330/52 |
| 4,926,136 | 5/1990 | Olver | 330/149 |
| 5,012,490 | 4/1991 | Myer | 375/58 |
| 5,304,945 | 4/1994 | Myer | 330/149 |
| 5,430,893 | 4/1995 | Myer | 455/209 |
| 5,619,168 | 4/1997 | Myer | 330/149 |
| 5,796,304 | 8/1998 | Gentzler | 330/52 |
| 5,847,603 | 12/1998 | Myer | 330/52 |

*Primary Examiner*—Robert Pascal
*Assistant Examiner*—Patricia T. Nguyen
*Attorney, Agent, or Firm*—Julio A. Garceran

[57] ABSTRACT

A pilot signal detection system uses a band reject filter to reject the frequency band of at least one carrier signal to improve pilot signal detection. For example, in a feed forward distortion reduction system, the carrier signal(s) is on a main signal path along with a pilot signal which is injected into the main signal path at a frequency adjacent to the frequency band of the carrier signal(s). The carrier signal(s) and the pilot signal are amplified on the main signal path, resulting in distortion on the main signal path. To reduce the distortion from the main signal path, the feed forward distortion reduction system detects and reduces the pilot signal. To improve detection of the pilot signal, the pilot signal detection system provides a signal representative of the carrier signal(s) and the pilot signal with distortion from the main signal path onto a pilot detection path. A band reject filter on the pilot detection path rejects the frequency band of the carrier signal(s) while allowing the frequency of the pilot signal to pass through to pilot detect circuitry. Without the presence of the carrier signal(s), the pilot detect circuitry can more accurately detect the pilot signal on the pilot detection path. In response to the detected pilot signal, the pilot detect circuitry can provide control signal(s) to improve the reduction of the pilot signal by changing the relative phase and/or gain between the signals on the main signal path and the feed forward path. Thus, by improving the detection of the pilot signal, the pilot detection system improves the reduction of the pilot signal and thereby of the distortion.

15 Claims, 4 Drawing Sheets

PILOT SIGNAL DETECTION SYSTEM USING BAND REJECT FILTER

BACKGROUND OF THE INVENTION

1. Field of the Invention

This invention relates to amplifiers and, more particularly, to a feed forward distortion reduction system using a band reject filter.

2. Description of Related Art

Amplifiers often add undesired distortion to a signal, creating an output signal comprising distortion or nonlinear components and the signal component. The distortion includes any undesired signals added to or affecting adversely the input signal. There is therefore a need to devise techniques that can eliminate substantially or reduce significantly the distortion produced by the amplifier.

Feed-forward correction is routinely deployed in modern amplifiers to improve amplifier linearity with various input patterns. The essence of the feed-forward correction is to manipulate distortion, such as intermodulation (IMD) components, created by the amplifier so that at the final summing point, the distortion cancels out. Due to the unpredictability of input RF carrier pattern as well as the resultant distortion location, a known frequency component, i.e. a pilot signal, is injected in the main signal path with the distortion produced by the amplification process. In feed-forward amplifiers, the feed forward distortion reduction circuitry minimizes the pilot signal along with the distortion. As such, by designing the feed forward distortion reduction circuitry to detect and cancel the pilot signal, the distortion can also be removed.

The pilot signal is an electrical signal comprising at least one frequency component spectrally located near the frequency band of operation of the electrical circuit. A more complete description of the pilot signal is shown in FIG. 1 which shows the frequency response of a radio frequency (RF) amplifier including the location of the pilot signal. The pilot signal can be near the lower edge of the operating band (e.g., pilot 1) and/or located near the upper edge of the band of operation (e.g., pilot 2). The pilot is positioned a spectral distance of $\Delta f$ from an edge of the band of operation whose center frequency is $f_0$. The electrical characteristics (e.g., amplitude, phase response, spectral content) of the pilot signal are known. It should be noted that although the pilot signal is shown as having one or two spectral components of a certain amplitude, the pilot signal can comprise a plurality of spectral components having various amplitudes.

The feed forward distortion reduction circuitry reduces distortion produced by the RF amplifier by applying the pilot signal to the RF amplifier and making adjustments based on information obtained from the applied pilot signal. FIG. 2 discloses feed-forward correction circuitry 10 and its use of information obtained from the pilot signal to reduce distortion produced by RF amplifier 12. An input signal, for example including at least one carrier signal, is applied to a splitter 14. The splitter 14 replicates the input signal on a main signal path 16 and a feed forward path 18. The splitter 14 is part of a feed forward loop referred to as loop #1, which in addition to the splitter 14, comprises gain & phase circuit 20, coupler 22, the RF amplifier 12, delay circuit 24 and couplers 26 and 28. The signal on the main path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to interfere with the operation of the amplifier 12. The output of coupler 22 is applied to the amplifier 12 whose output comprises the amplified input signal, the amplified pilot signal and distortion signals produced by the amplifier 12. A portion of the output of the amplifier 12 is obtained from the coupler 26 and is combined at the coupler 28 via coupling path 30 with a delayed version of the input signal on the feed forward path 18 to isolate the pilot signal with distortion on the feed forward path 18. The input signal on the feed forward path 18 is sufficiently delayed by delay circuit 24 so that such signal experiences the same delay as the signal appearing at the coupler 28 via the path 30.

The gain & phase circuit 20 is controlled via control path 32 with control signals to adjust the gain and/or phase of the signal such that the signal appearing at the coupler 28 via the path 30 is substantially the inverse (equal in amplitude but 180° out of phase) of the delayed input signal at the coupler 28. The control signal(s) appearing on the control path 32 of the gain & phase circuit 20 is derived from the signal at the output of the coupler 28 in a well known manner using a detection circuit 33. The detection circuit 33 can include a log detector connected to a nulling circuit. As such, the amplitude of the input signal, such as a carrier signal, is detected, and the nulling circuit attempts to reduce the amplitude of the carrier signal by providing the control signals on the control path 32. Alternative detection circuits can detect well known electrical signal characteristics such as amplitude, phase, and/or frequency of the signal. The input signals applied to the coupler 28 substantially cancel each other leaving at the output of the coupler 28 the pilot signal with distortion produced by the amplifier 12. Loop #1 is thus a feed forward loop which serves to isolate on the feed forward path 18 the pilot signal with distortion produced by the amplifier 12.

The pilot signal with distortion at the output of the coupler 28 is fed to gain & phase circuit 34 whose output is fed to amplifier 36 whose output is applied to coupler 38. A portion of the signals on the main signal path 16 (carrier signal(s), pilot signal with distortion) after the amplifier 12 is fed to a delay circuit 40 whose output is fed to the coupler 38. The delay circuit 40 is designed such that signals from the output of the amplifier 12 applied to the coupler 38 experience substantially the same delay as the signals from the output of the amplifier 36 applied to the coupler 38.

Because the frequency, amplitude and other electrical characteristics of the pilot signal are known, pilot detect circuitry 42 can use detection circuits such as a log detector (or other well known detection circuits) to detect the amplitude of the pilot signal or a portion of the pilot signal via coupler 44 and a nulling circuit to reduce the amplitude of the pilot signal by providing control signals to the phase and gain circuit 34. In general, the detection circuitry 42 will detect the pilot signal and use this information to generate control signals onto path 46 to cause the gain & phase circuit 34 to modify the pilot signal on the feed forward path 18 such that the pilot signal on the main path 16 is substantially the inverse (equal in amplitude but 180° out of phase) of the pilot signal on the feed forward path 18 at the coupler 38. The corresponding pilot signals and distortion substantially cancel each other at the coupler 38 leaving the carrier signal(s) at the output of the system. Therefore, loop #2, which comprises the coupler 26, the coupler 28, the gain & phase circuit 34, the amplifier 36, the coupler 38 and the delay circuit 40 is a feed forward loop which attempts to cancel the pilot signal to cancel substantially the distortion produced by the amplifier 12.

In actual systems, however, there is rarely an absolute cancellation of the distortion and the pilot signals. This is at least partially explained by the difficulty in detecting the pilot signal after cancellation. The amplitude of the pilot signal is typically relatively small at the output of the feed forward distortion reduction system because of the cancellation of the pilot and the relative amplitude of the pilot signal with respect to the amplitude of the in-band carrier signal(s). Thus, a need exists for pilot detection systems to improve the detection of the pilot signal. With improved pilot signal detection, improved reduction of the pilot signal can be achieved, resulting in improved distortion reduction.

SUMMARY OF THE INVENTION

The present invention involves a pilot signal detection system which uses a band reject filter to reject the frequency band of at least one carrier signal to improve pilot signal detection. For example, in a feed forward distortion reduction system, the carrier signal(s) is on a main signal path along with a pilot signal which is injected into the main signal path at a frequency adjacent to the frequency band of the carrier signal(s). The carrier signal(s) and the pilot signal are amplified on the main signal path, resulting in distortion on the main signal path. To reduce the distortion from the main signal path, the feed forward distortion reduction system detects and reduces the pilot signal. To improve detection of the pilot signal, the pilot signal detection system provides a signal representative of the carrier signal(s) and the pilot signal with distortion from the main signal path onto a pilot detection path. A band reject filter on the pilot detection path rejects the frequency band of the carrier signal(s) while allowing the frequency of the pilot signal to pass through to pilot detect circuitry. Without the presence of the carrier signal(s), the pilot detect circuitry can more accurately detect the pilot signal on the pilot detection path. In response to the detected pilot signal, the pilot detect circuitry can provide control signal(s) to improve the reduction of the pilot signal by changing the relative phase and/or gain between the signals on the main signal path and the feed forward path. Thus, by improving the detection of the pilot signal, the pilot detection system improves the reduction of the pilot signal and thereby of the distortion.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
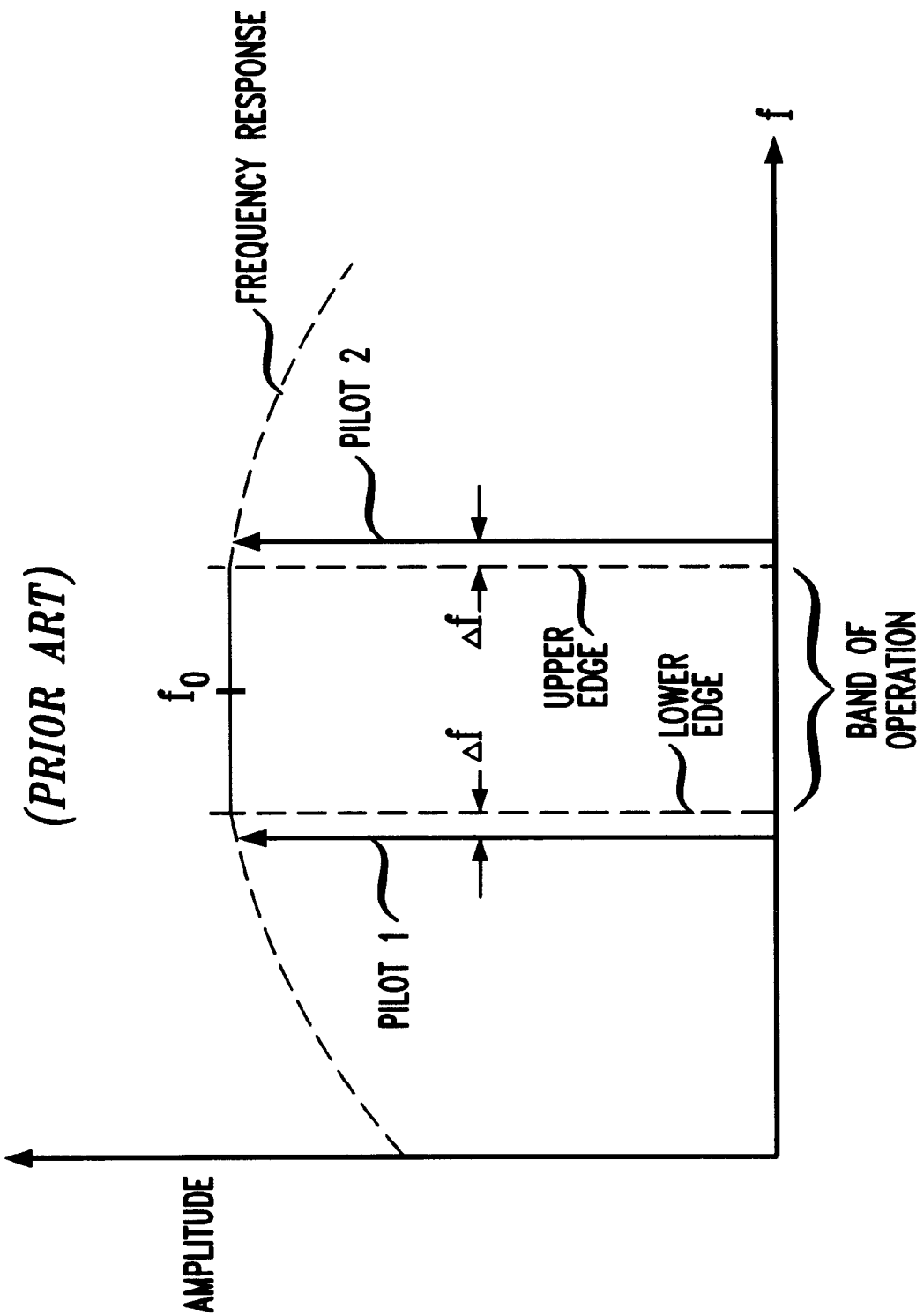
FIG. 1 shows an example frequency response curve of an RF amplifier showing the frequency within which the amplifier is operating.
Figure 2:
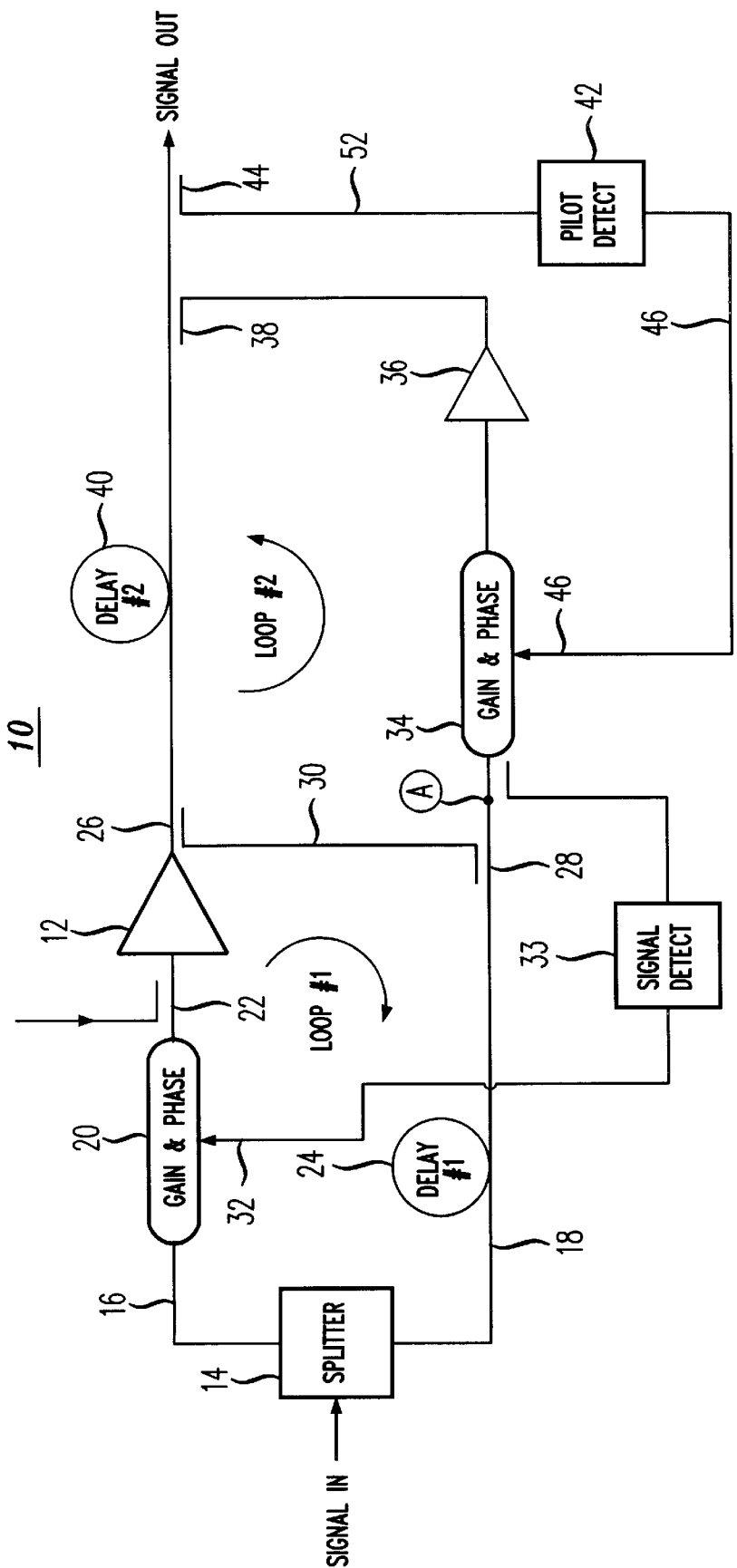
FIG. 2 is a block diagram of a prior art feed forward distortion reduction scheme used for RF amplifiers.
Figure 3:
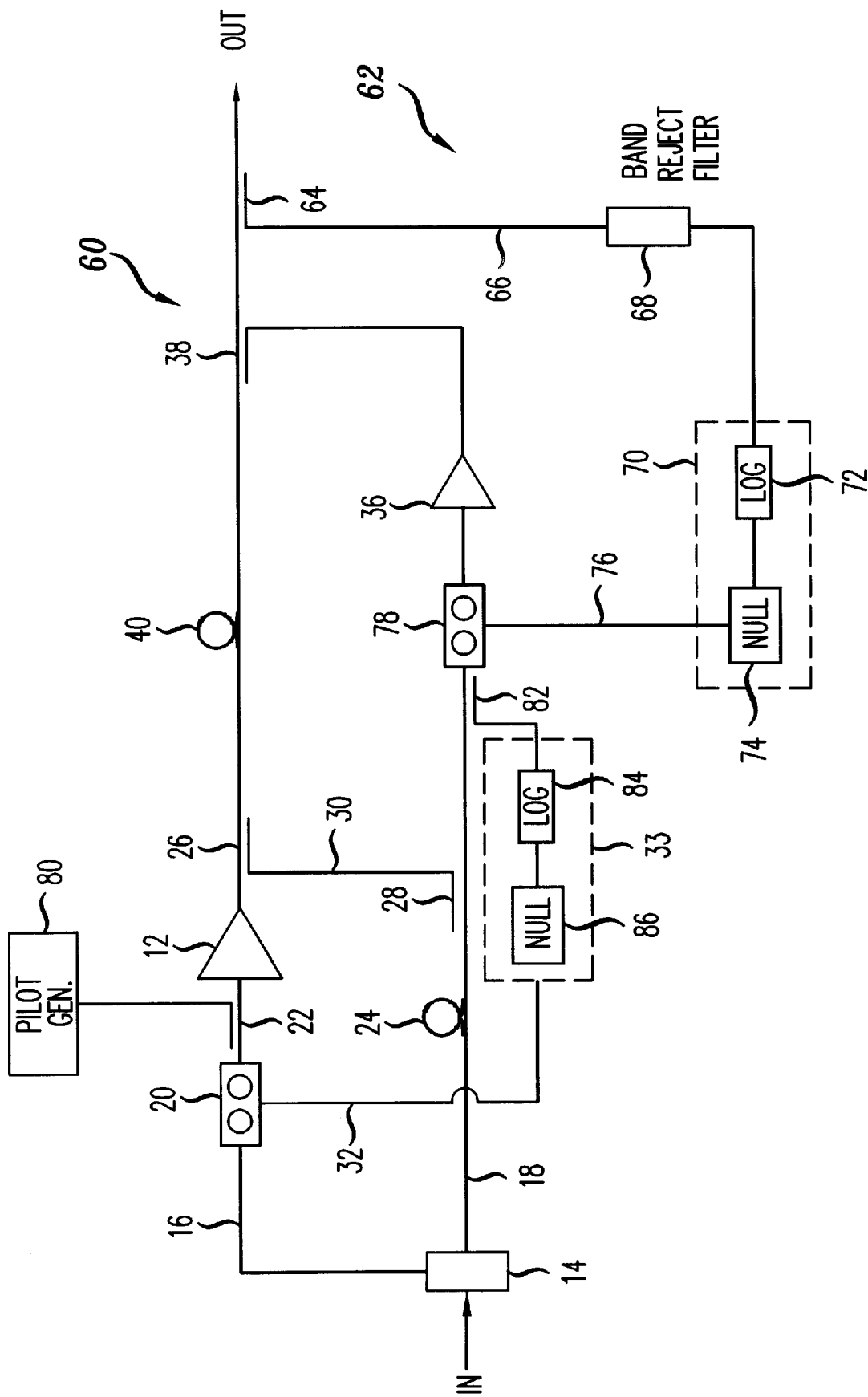
FIG. 3 shows a general block diagram of a feed forward distortion reduction system using gain and phase control according to the principles of the present invention.

An illustrative embodiment of a pilot signal detection system according to the principles of the present invention is described below in a feed forward distortion reduction system. FIG. 3 shows a general block diagram of a feed forward distortion reduction system 60 which uses a pilot signal detection system 62 to improve the detection of the pilot signal. In this embodiment, the pilot signal detection system 62 includes a coupler 64 which provides a radio frequency (RF) representation of the amplified carrier signal (s) and the pilot signal from the main signal path 16 onto a pilot signal detection path 66. A band reject filter 68 rejects the frequency band of the carrier signal(s) but allows the pilot signal(s) to pass through to pilot detect circuitry 70. By rejecting the carrier signal(s), the band reject filter 68 improves pilot signal detection by enabling the pilot detection circuitry 70 to detect a wider range of amplitudes for the pilot signal(s) because the carrier signals are not interfering with the pilot signal(s). It is desirable to locate the pilot as close as possible to the carrier frequency band, so that the pilot signal accurately reflects the amplifier response to the carrier frequencies. In doing so, however, the presence of the carrier signals hampers the ability to detect the lower amplitude reduced pilot signals. By using the band reject filter 68, the carrier signals are rejected from the pilot signal detection path 66, and the reduced pilot signal can be more accurately measured by the pilot detection circuitry 70.

The pilot detect circuitry 70 can include a log detector 72, which provides a direct current (DC) signal representative of the amplitude of the pilot signal, and a nulling circuit 74 which attempts to reduce the amplitude of the pilot signal by providing gain and/or phase adjustments on the control line 76 to a gain and phase circuit 78 on the feed forward path 18. Because the band reject filter 68 enables more of the amplitude of the pilot signal to be detected by pilot detect circuitry 70, the pilot detection system 62 can provide gain and/or phase control signals to more precisely cancel the pilot signal at the coupler 38, thereby improving the cancellation of the distortion on the main signal path 16.

In operation, the feed forward distortion reduction system 60 receives the signal S to be amplified, and the splitter 14 provides an analog representation of the signal S onto the main signal path 16 and the feed forward path 18. The signal S on the main signal path 16 is applied to the gain & phase circuit 20. The output of gain & phase circuit 20 is applied to the main leg of a coupler 22. A pilot signal generator 80 generates a pilot signal and provides the pilot signal to a second leg of the coupler 22 which injects the pilot signal into the main signal path. The pilot signal can have one or more spectral components or varying spectral components. In this embodiment, the pilot generator 80 generates a pilot signal with spectral components adjacent to and on either side of the carrier frequency band. For example, the pilot signal can be generated with spectral components at about 850 MHz and/or 920 MHz with the carrier frequency band being at between 870 and 900 MHz. In this embodiment, the pilot signal(s) will be about 30 dB below the carrier signal (s).

The pilot signal and the carrier signal on the main signal path 16 are applied to the amplifier 12 whose output comprises the amplified signal S, the amplified pilot signal P and distortion D produced by the amplifier 12. A portion of the output S, P and D of the amplifier 12 is placed on the coupling path 30 via the coupler 26 and combined with a delayed version of the signal S on the feed forward path 18 to isolate the pilot P with distortion D on the feed forward path 18.

The gain & phase circuit 20 is controlled by a phase and gain controller 33 to adjust the gain and phase of the carrier signal S on the main signal path 16 prior to the amplifier 12 such that the amplified signal S, P with D at the coupler 28 is substantially the inverse (equal in amplitude but 180° out of phase) of the delayed signal S on the path 18. As such, the combining signals cancel to isolate the pilot P and distortion D on the feed forward path 18. The control signal(s) appearing on the control path(s) 32 of the gain & phase circuit 20 can be derived from the portion of the amplified signal S, P and D on the coupling path 30 and the delayed version of the signal S on the path 18 and/or from the output of the coupler 28. In this embodiment, the gain controller 33 receives a signal representing the output of the coupler 28 from a coupler 82 to determine how well the cancellation of the carrier signal S occurred at the coupler 28. The gain and phase controller 33 can include a log detector 84, which provides a direct current (DC) signal representative of the amplitude of the signal from the coupler 82, and a nulling circuit 84 which attempts to reduce the amplitude of the signal S by providing gain and/or phase adjustments on the control line 32 to the gain and phase circuit 20 on the main signal path 16. As the cancellation of the combining signals S improves, the feed forward distortion reduction improves the isolation of the pilot P and distortion D on the feed forward path 18.

The isolated pilot P and distortion D on the feed forward path 18 are fed forward to cancel with the pilot P and distortion D on the main signal path 16. In this embodiment, the output of the coupler 82 is applied to the gain & phase adjuster 78 which adjusts the pilot signal P and distortion D on the feed forward path 18 according to phase and gain control signals from the pilot detection circuit 70. The output of gain and phase adjuster 78 is applied to the amplifier 36 whose output comprises the amplified pilot signal and distortion D. The amplified pilot signal and distortion D is output from the amplifier 36 provided to the coupler 38. The coupler 38 destructively combines corresponding portions of the signals P and D from the feed forward path with those on the main signal path 16 to produce at the output of the coupler 38, the amplified signal S with reduced pilot signal P and distortion D.

Figure 4:
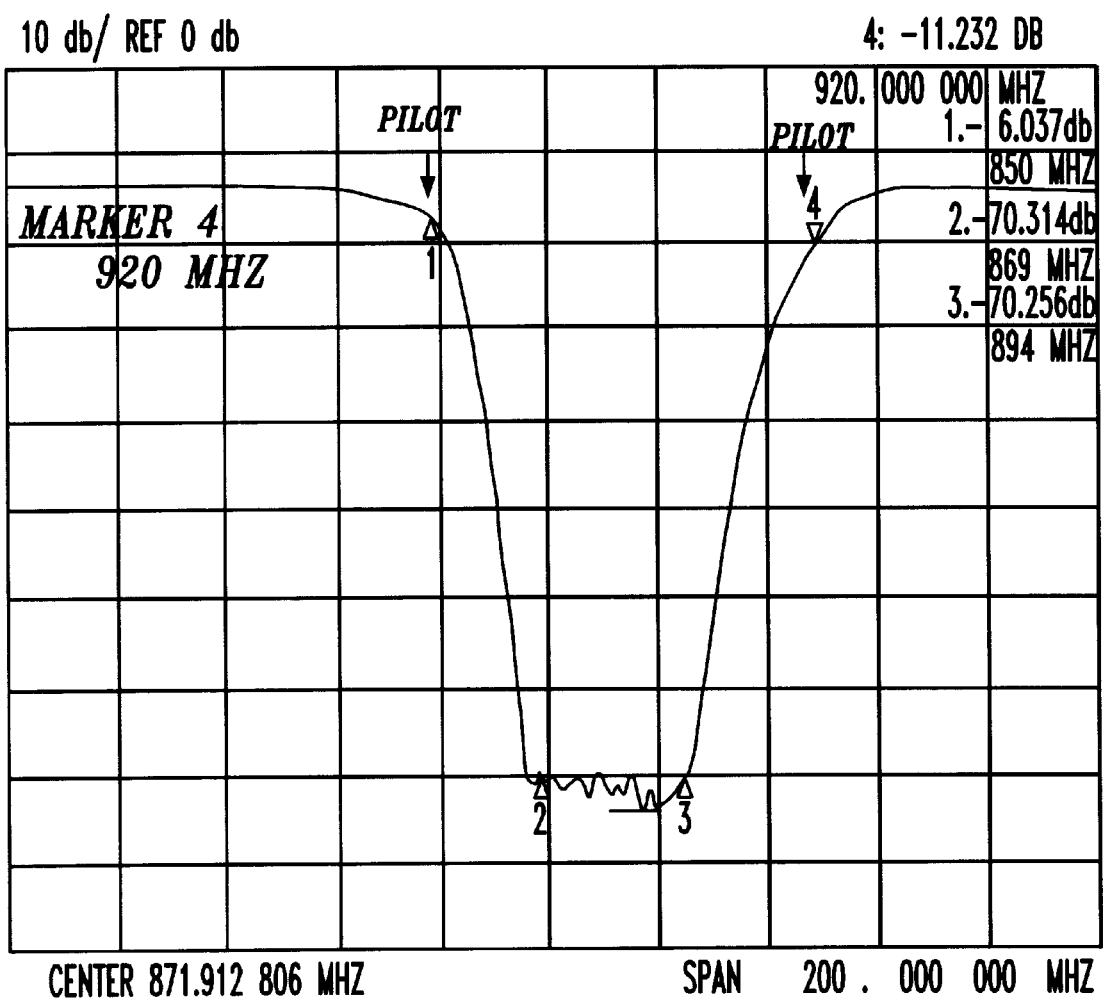
FIG. 4 shows a graphical representation of the frequency response of a band reject filter according to the principles of the present invention.

To improve the reduction of the pilot signal P and thereby of the distortion D, a representation of the amplified signal S and reduced pilot signal P with distortion D is obtained from the output of the system 60 and placed on a pilot signal detection path 66 using the coupler 64. To improve the detection of the pilot signal on the pilot detection path 66, the band reject filter 68 is provided on the pilot detection path 66. FIG. 4 shows a graphical representation of the frequency response for the band reject filter 68 in an embodiment of the pilot detection system 62. As shown, pilot signals at 850 MHz and 920 MHz pass through the band reject filter 68 to the pilot detection circuitry 70, but the band reject filter rejects the in band carrier signals, for example between approximately 869 MHz and 894 MHz. Other frequency bands can be rejected by the band reject filter 68, such as 1.9–2.0 gigahertz (GHz) or 2.1–2.2 GHz. The pilot detection circuitry can detect a wider range of amplitudes for the reduced pilot signal(s) because the carrier signals are not hampering or interfering with the detection of the pilot signal(s). By using the band reject filter 68, the carrier signals are rejected from the pilot signal detection path 66, and the reduced pilot signal can be more accurately measured by the pilot detection circuitry 70. For example, in FIG. 4, the band reject filter 68 rejects the carrier signal(s) by about 60 dB which improves the ability to detect the pilot signal(s).

In this embodiment, the pilot detection circuitry 70 includes the log detector 72 which receives the reduced pilot signal on the pilot detection path 66 from the band reject filter 68. The log detector 72 produces a DC signal representative of the amplitude of the pilot signal on the path 66. A nulling circuit 74 receives the signal representative of the amplitude of the pilot signal and attempts to reduce the amplitude of the amplitude signal from the log detector 72 by providing gain and/or phase control signals to adjust the relative phase and/or gain between the signal combining at the coupler 38. In this embodiment, the pilot detect circuitry 70 provides the gain and/or phase control signals to the gain and phase circuit 78 on the feed forward path 18. As such, the pilot signal detection circuit 70 provides gain and/or phase control signals to adjust the gain and /or phase adjustments performed on the pilot signal P and distortion D on the feed forward path 18 to improve cancellation of the pilot signal P with the distortion D from the main signal path 16 at the coupler 38. By improving the detection of the pilot signal after cancellation or reduction, the pilot detection system 62 can improve the reduction of the pilot signal and thereby of the distortion. In this embodiment, the pilot signal is reduced to about 60 dB in amplitude below the carrier signal(s).

In addition to the embodiment described above, alternative configurations of the pilot signal detection system according to the principles of the present invention are possible which omit and/or add components and/or use variations or portions of the described system. Additionally, the embodiment of the pilot detection system has been described as being used with a particular feed-forward RF amplifier arrangement, but the pilot detection system can be used to improve pilot signal detection in other amplifier or electrical circuit arrangements using a pilot signal. Additionally, the pilot detection system has been described as detecting the pilot signal(s) on both or either side of a carrier frequency band, but the pilot detection system can be used to detect a single, changing or multiple pilot signals, and the pilot signal can be positioned relative to a frequency band with multiple carriers or the frequency band of a single carrier whether outside or inside the frequency band of the multiple carriers. The pilot detection system has been described with a band reject filter which rejects the frequency band of the carrier signal(s) and permits adjacent frequencies as shown in FIG. 4. Other filters with different responses are possible which reject the carrier frequencies while allowing the pilot signal(s) to pass. Furthermore, the pilot detection system has been described as detecting pilot signal amplitude, but other parameters or characteristics of the pilot signal can be detected.

The system has been described as using couplers, but other devices, such as 3 dB splitters and other coupling, signal splitting or sampling devices, can be used as well as other combining devices, such as summers. Depending on the application, the gain and/or phase circuitry can be positioned in different locations and/or paths within the feed forward amplifier arrangement. The pilot detection system has been further described as using different configurations of discrete components, but it should be understood that the feed forward system and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

I claim:

1. A method of reducing a pilot signal on a main signal path carrying at least one carrier signal, said method comprising the steps of:

providing to a pilot detection path a pilot detection signal representative of said at least one carrier signal and said pilot signal on said main signal path;

rejecting from said pilot detection signal a frequency band of said at least one carrier signal while passing a frequency for said pilot signal;

detecting an amplitude for said pilot detection signal; and responding to said amplitude of said pilot detection signal by providing at least one control signal to alter the amplitude of said pilot signal on said main signal path.

2. The method of claim 1 further including the steps of:

splitting said at least one carrier signal onto said main signal path and a feed forward path;

injecting said pilot signal into said main signal path;

amplifying said at least one carrier signal and said pilot signal on said main signal path which produces distortion on said main signal path;

obtaining a portion of said pilot signal and said at least one carrier signal with distortion from said main signal path;

combining said portion of said pilot signal and said at least one carrier signal with distortion and said at least one carrier signal on said feed forward path to produce said pilot signal with said distortion on said feed forward path; and using said pilot signal with said distortion on said feed forward path to reduce said pilot signal with said distortion on said main signal path.

3. The method of claim 2 wherein said step of using further including the steps of:

amplifying said pilot signal with said distortion on said feed forward path;

adjusting the relative phase and amplitude between said pilot signal with said distortion on said feed forward path and said pilot signal with said distortion on said main signal path; and combining said pilot signal with said distortion from feed forward path with said pilot signal with said distortion on said main signal path to reduce said pilot signal with said distortion on said main signal path.

4. The method of claim 3 wherein said step of responding further including the step of:

responding to said amplitude of said pilot detection signal by providing at least one control signal to alter the relative phase and/or amplitude between said pilot signal with said distortion on said feed forward path and said pilot signal with said distortion on said main signal path to reduce the amplitude of said pilot signal with said distortion on said main signal path.

5. A distortion reduction system for reducing a pilot signal on a main signal path for carrying at least one carrier signal, said system comprising:

a first splitting device on said main signal path provides a pilot detection signal representative of said at least one carrier signal and said pilot signal on said main signal path to a pilot detection path;

a band reject filter on said pilot detection path receives said pilot detection signal and rejects from said pilot detection signal a frequency band of said at least one carrier signal while passing a frequency for said pilot signal;

a signal detector detects an amplitude of said pilot detection signal from said band reject filter; and control circuitry responsive to said amplitude of said pilot detection signal by providing at least one control signal to alter the amplitude of said pilot signal on said main signal path.

6. The system of claim 5 further including:

a second spitting device configured to receive said at least one carrier signal and provide said at least one carrier signal to said main signal path and a feed forward path;

a combining device on said main signal path injects said pilot signal on said main signal path;

an amplifier on said main signal path amplifies said at least one carrier signal and said pilot signal and produces distortion on said main signal path;

a third splitting device on said main signal path provides a portion of said at least one carrier signal and said amplified signal from said main signal path;

a second combining device configured to combine said portion of said at least one carrier signal and said pilot signal with said distortion and said at least one carrier signal on said feed forward path to produce said pilot signal with said distortion on said feed forward path; and a feed forward loop including said feed forward path configured to use said pilot signal with said distortion on said feed forward path to reduce said pilot signal with said distortion on said main signal path.

7. The system of claim 6 wherein said feed forward loop including:

a second amplifier on said feed forward path amplifies said pilot signal with distortion on said feed forward path;

a gain and phase adjuster adjusts the relative phase and amplitude between said pilot signal with said distortion on said feed forward path and said pilot signal with said distortion on said main signal path; and a third combining device on said main signal path combines said pilot signal with said distortion from said feed forward path with said pilot signal with said distortion on said main signal path to reduce said pilot signal with said distortion on said main signal path.

8. The system of claim 7 wherein said control circuitry responds to said amplitude of said pilot detection signal by providing at least one control signal to said gain and phase adjuster to alter the relative phase and/or amplitude between said pilot signal with said distortion on said feed forward path and said pilot signal with said distortion on said main signal path to reduce the amplitude of said pilot signal with said distortion on said main signal path.

9. The method of claim 1 wherein said rejecting and detecting further including:

rejecting from said pilot detection signal said frequency band being less than a first frequency and greater than a second frequency; and detecting said amplitude for said pilot detection signal at at least one of said first frequency and said second frequency.

10. The system of claim 5 wherein said band reject filter passes a first frequency and a second frequency and rejects from said pilot detection signal said frequency band being less than said first frequency and greater than said second frequency.

11. The system of claim 10 wherein said signal detector detects a characteristic of said pilot detection signal at at least one of said first frequency and said second frequency.

12. A method of reducing a pilot signal, said method comprising the steps of:

injecting on a main signal path a pilot signal with at least one frequency component adjacent to a frequency band of at least one carrier signal on said main signal path;

providing to a pilot detection path a pilot detection signal representative of said at least one carrier signal and said pilot signal on said main signal path;

rejecting from said pilot detection signal said frequency band of said at least one carrier signal while passing said at least one spectral component of said pilot signal adjacent to said frequency band of said at least one carrier signal; and detecting on said pilot detection path a characteristic of said at least one spectral component of said pilot signal adjacent to said frequency band of said at least one carrier signal.

13. The method of claim 12 wherein said rejecting and detecting further including:

rejecting from said pilot detection signal said frequency band while passing a first frequency less than said frequency band and a second frequency greater than said frequency band; and detecting a characteristic of said at least one spectral component of said pilot signal at at least one of said first frequency and said second frequency.

14. A distortion reduction system for reducing a pilot signal having at least one spectral component adjacent to a frequency band of at least one carrier signal on a main signal path, said system comprising:

a first splitting device on said main signal path provides a pilot detection signal representative of said at least one carrier signal and said pilot signal on said main signal path to a pilot detection path;

a band reject filter on said pilot detection path receives said pilot detection signal and rejects from said pilot detection signal said frequency band of said at least one carrier signal while passing said at least one spectral component of said pilot signal adjacent to said frequency band; and a signal detector detects a characteristic of said at least one spectral component of said pilot signal adjacent to said frequency band of said at least one carrier signal.

15. The system of claim 14 wherein said band reject filter passes a first frequency and a second frequency and rejects from said pilot detection signal said frequency band being less than said first frequency and greater than said second frequency; and wherein said signal detector detects a characteristic of said pilot detection signal at at least one of said first frequency and said second frequency.

\* \* \* \* \*